(12) United States Patent
Bertram

(10) Patent No.: US 7,358,775 B2
(45) Date of Patent: Apr. 15, 2008

(54) INVERTING DYNAMIC REGISTER WITH DATA-DEPENDENT HOLD TIME REDUCTION MECHANISM

(75) Inventor: Raymond A. Bertram, Austin, TX (US)

(73) Assignee: Via Technologies, Inc., Taipei (TW)

( * ) Notice: Subject to any disclaimer, the term of this patent is extended or adjusted under 35 U.S.C. 154(b) by 135 days.

(21) Appl. No.: 11/332,496

(22) Filed: Jan. 14, 2006

(65) Prior Publication Data

US 2006/0158226 A1 Jul. 20, 2006

Related U.S. Application Data

(60) Provisional application No. 60/643,891, filed on Jan. 14, 2005.

(51) Int. Cl.
*H03K 19/096* (2006.01)
(52) U.S. Cl. .......................... 326/98; 326/95
(58) Field of Classification Search .................. 326/95, 326/98
See application file for complete search history.

(56) References Cited

U.S. PATENT DOCUMENTS

| | | | |
|---|---|---|---|
| 5,075,386 A | 12/1991 | Vanderbilt | |
| 5,889,979 A | 3/1999 | Miller, Jr. et al. | |
| 6,191,618 B1 | 2/2001 | Gayles et al. | |
| 6,496,038 B1 | 12/2002 | Sprague et al. | |
| 6,628,143 B2 | 9/2003 | Hsu et al. | |
| 6,650,145 B2 | 11/2003 | Ngo et al. | |
| 6,965,254 B2 * | 11/2005 | Lundberg | 326/98 |
| 7,212,039 B2 * | 5/2007 | Qureshi et al. | 326/98 |
| 2002/0158670 A1 | 10/2002 | Alvandpour | |
| 2003/0042932 A1 | 3/2003 | Bales | |
| 2003/0052714 A1 | 3/2003 | Alvandpour | |
| 2003/0110404 A1 | 6/2003 | Seningen et al. | |
| 2004/0034681 A1 | 2/2004 | Bertram | |
| 2004/0113658 A1 * | 6/2004 | Lundberg | 326/95 |
| 2005/0046446 A1 * | 3/2005 | Qureshi et al. | 326/95 |
| 2005/0127952 A1 | 6/2005 | Bertram | |
| 2006/0033534 A1 | 2/2006 | Lundberg et al. | |

* cited by examiner

*Primary Examiner*—Vibol Tan
(74) *Attorney, Agent, or Firm*—Richard K. Huffman; James W. Huffman

(57) ABSTRACT

Dynamic logic register including evaluation logic, delay logic, latching logic, and a keeper circuit. The evaluation logic evaluates a logic function based on data input. The logic function evaluates to either a first state or a second state. The delay logic generates a kill signal, where the kill signal is a delayed version of a clock signal, and where the delay between the clock and kill signals comprises a hold time, and where the hold time is shortened when the logic function evaluates to the first state. The latching logic is responsive to the clock and kill signals and the state of pre-charged node, and controls the state of an output node based on the state of a pre-charged node during an evaluation period between an operative edge of the clock signal and the next edge of the kill signal, and otherwise presents a tri-state condition to said output node.

18 Claims, 5 Drawing Sheets

CONVENTIONAL DYNAMIC EVALUATION CIRCUIT

INVERTING DYNAMIC REGISTER WITH HOLD TIME REDUCTION MECHANISM

*NON-INVERTING DYNAMIC REGISTER WITH HOLD TIME REDUCTION MECHANISM*

INVERTING DYNAMIC REGISTER WITH DATA-DEPENDENT HOLD TIME REDUCTION MECHANISM

CROSS-REFERENCE TO RELATED APPLICATIONS

This application claims the benefit of U.S. Provisional Application Ser. No. 60/643891, filed on Jan. 14, 2005, which is herein incorporated by reference for all intents and purposes.

BACKGROUND OF THE INVENTION

1. Field of the Invention

The present invention relates to dynamic logic and register functions, and more particularly to a dynamic logic register that provides registered outputs for logic evaluation functions, where the hold time of the register is dependent on the state of the input data to the register.

2. Description of the Related Art

Integrated circuits use a remarkable number of registers, particularly those having a synchronous pipeline architecture. Register logic is employed to hold the outputs of devices and circuits for a period of time so that these outputs can be received by other devices and circuits. In a clocked system, such as a pipeline microprocessor, registers are used to latch and hold the outputs of a given pipeline stage for a period of one clock cycle so that input circuits in a subsequent stage can receive the outputs during that period while the given pipeline stage is concurrently generating new outputs.

In the past, it has been common practice to precede and follow complex logical evaluation circuits, such as multiple-input multiplexers (muxes), multi-bit encoders, etc., with registers to hold the inputs to and the outputs from the evaluation circuits. Generally, these registers have associated setup and hold time requirements, both of which constrain the evaluation circuits in the preceding stage. In addition, registers have corresponding clock-to-output time characteristics, which constrain the evaluation circuits in subsequent stages. The "speed" of a register is typically judged in terms of its data-to-output time, that is, the sum of its setup time and clock-to-output time.

Preceding and following a logical evaluation circuit with traditional register circuits introduces delays into a pipeline system whose cumulative effect results in significantly slower operating speeds. More specifically, one notable source of these delays is the setup time requirements that must be satisfied by logical evaluation circuits in order to ensure stable registered outputs. It is desired to reduce these delays to provide additional time in each stage and to thereby increase overall speed of the pipeline system. Techniques used to reduce the setup and clock-to-output delays (e.g., domino-type configurations) often introduce increased hold time requirements. In particular, when a data input is clocked into these register circuits, the state of the data input must be held constant for a specified period of time (i.e., the "hold" time) before it can change. If it changes before the hold time expires, then an incorrect registered output possible.

Many devices, to include conventional domino-type circuits, exhibit a hold time requirement that is approximately the width of a corresponding clock pulse. Consequently, to reduce the hold time requirement for a conventional domino circuit, many designers employ a pulsed clock signal, that is, a clock signal whose "clocking" state is significantly short in duration as compared to its non-clocking state. It is not uncommon today to find pulsed clock signals having less than 10 percent duty cycles for their corresponding clocking states.

Accordingly, it is also desired to provide a registered evaluation circuit apparatus and methods which exhibit markedly reduced hold time requirements, and which moreover exhibit hold time requirements that are not dependent upon providing a corresponding pulsed clock signal.

SUMMARY OF THE INVENTION

The present invention, among other applications, is directed to solving the above-noted problems and addresses other problems, disadvantages, and limitations of the prior art.

The present invention provides a superior technique for registering a logic function while reducing hold time requirements. In one embodiment, an inverting dynamic logic register is provided. The inverting dynamic logic register includes a complementary pair of evaluation devices, evaluation logic, delay logic, latching logic; and a keeper circuit. The complementary pair of evaluation devices are responsive to a clock signal. The evaluation logic is coupled between the complementary pair of evaluation devices at a pre-charged node. The evaluation logic evaluates a logic function based on at least one input data signal, where the logic function evaluates to either a first state or a second state. The delay logic is coupled to the clock signal. The delay logic generates a kill signal, where the kill signal is a delayed version of the clock signal, and where the delay between the clock and kill signals comprises a hold time, and where the hold time is shortened when the logic function evaluates to the first state. The latching logic is responsive to the clock and kill signals and the state of the pre-charged node. The latching logic controls the state of an output node based on the state of the pre-charged node during an evaluation period between an operative edge of the clock signal and the next edge of the kill signal, and to otherwise presents a tri-state condition to the output node. The latching logic includes a first P-channel pull-up device and a plurality of N-channel pull-down devices. The a first P-channel pull-up device has a gate receiving the kill signal and a source and a drain coupled between a source voltage and a source of a second P-channel device, where the second P-channel device has a gate coupled to the pre-charge node and a drain coupled to the output node. The plurality of N-channel pull-down devices is coupled between the output node and a reference voltage, and controlled by the clock signal and the pre-charged node. The keeper circuit is coupled to the pre-charge node, and is configured to preserve the state of the pre-charge node when the evaluation logic evaluates the logic function to the second state during the evaluation period and the at least one input data signal changes state thereafter.

One aspect of the present invention contemplates a dynamic register circuit. The dynamic register circuit includes a dynamic circuit, delay logic, a latching circuit, a first keeper circuit, and a second keeper circuit. The dynamic circuit pre-charges a first node while a clock signal is low, and evaluates a logic function to either a first state or a second state, and controls the state of the first node when the clock signal goes high. The delay logic, receives the clock signal, and provides a kill signal, the kill signal being a delayed version of the clock signal, where the delay between the clock signal and the kill signal comprises a hold time, and where the hold time is shortened when the logic function evaluates to the first state. The latching circuit is coupled to the dynamic circuit and the delay logic, and is configured to control the state of an output node based on the state of the first node during an evaluation period beginning when the clock signal goes high and ending when the kill signal goes high, and that otherwise presents a tri-state condition to the output node. The latching circuit includes a first P-channel pull-up device and a plurality of N-channel pull-down devices. The a first P-channel pull-up device has a gate receiving the kill signal and a source and a drain coupled between a source voltage and a source of a second P-channel device, where the second P-channel device has a gate coupled to the first node and a drain coupled to the output node. The a plurality of N-channel pull-down devices is coupled between the output node and a reference voltage, and controlled by the clock signal and the first node. The first keeper circuit is coupled to the first node, and is configured to preserve the state of the first node when the dynamic logic evaluates the logic function to the second state during the evaluation period and one or more input data signals to the dynamic circuit change state thereafter. The second keeper circuit is coupled to the output node.

Another aspect of the present invention comprehends a method of dynamically registering an output signal. The method includes pre-setting a first node while a clock signal is in a first logic state; dynamically evaluating a logic function to either a first or second state to control the logic state of the first node when the clock signal transitions to a second logic state; delaying the clock signal and providing a kill signal, wherein the kill signal is a delayed replica of the clock signal; accelerating the kill signal when the logic function evaluates to the first state; latching a logic state of an output node based on the logic state of the first node determined during an evaluation period beginning when the clock signal transitions to the second logic state and ending with the next corresponding transition of the kill signal; maintaining the logic state of the output node between evaluation periods; and preserving the state of the first node during the evaluation period when the first node is at the second logic state. The latching includes first providing a first P-channel pull-up device having a gate receiving the kill signal and a source and a drain coupled between a source voltage and a source of a second P-channel device, where the second P-channel device has a gate coupled to the first node and a drain coupled to the output node; and second providing a plurality of N-channel pull-down devices, coupled between the output node and a reference voltage, and controlled by the clock signal and the pre-charge node.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The inventors of the present application have recognized the need for providing registered outputs for logic circuits in which speed is a critical factor and also for optimizing the overall design such as by reducing the number of devices to increase speed and reduce chip area consumed. In addition, they have recognized the need for more robust logic circuits having registered outputs which exhibit markedly reduced hold time requirements over that which has heretofore been provided, and having hold time requirements which are not directly tied to the duty cycle of a corresponding clocking signal. They have therefore developed dynamic logic registering apparatus and methods that provide for latched inputs and registered outputs for logic evaluation functions which are significantly faster than prior configurations, which minimize the hold time requirement for certain input data states, and which exhibit markedly reduced clock-to-output times over present day devices.

When employed in a pipeline architecture that relies heavily on registers to transfer data from stage to stage, an inverting dynamic logic register according to an embodiment of the present invention enables overall device operating speed to be significantly increased while reducing chip layout area and, in addition, ensuring a more robust design due to reduced hold time requirements.

Figure 1:
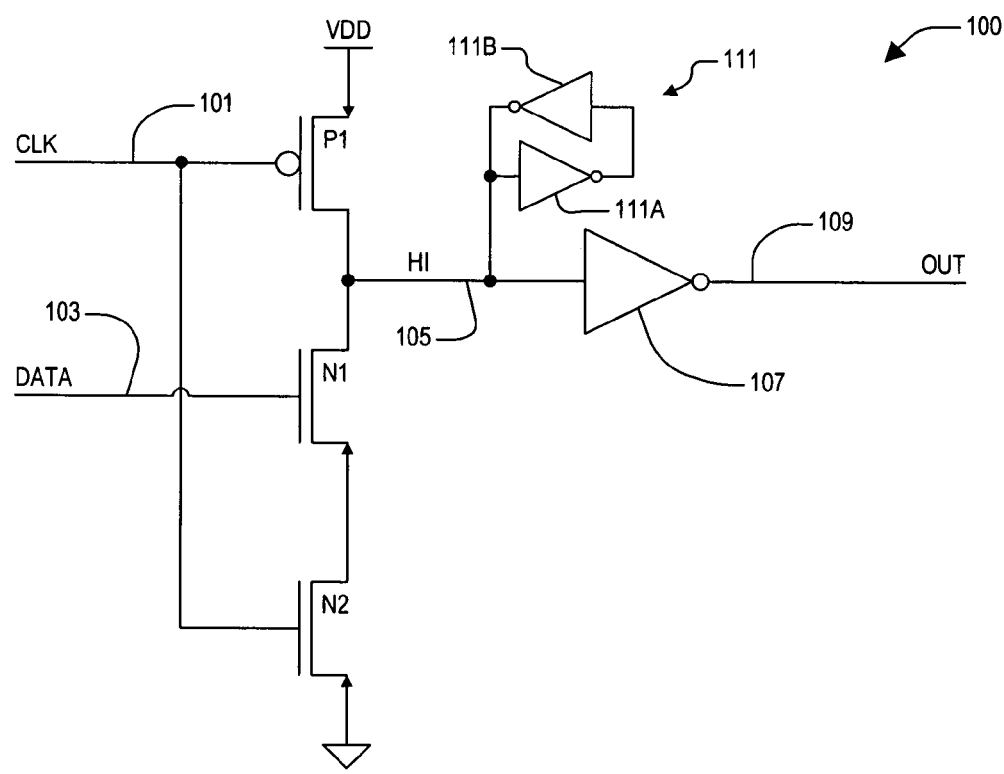
FIG. 1 is a schematic diagram of a prior art dynamic logic circuit.

FIG. 1 is a schematic diagram of prior art dynamic circuit 100 for illustrating present day dynamic circuit techniques. The dynamic circuit 100 is also referred to by those skilled in the art as a domino circuit 100 or domino logic 100. The dynamic circuit 100 includes an input portion consisting of stacked P-channel and N-channel devices P1, N1, and N2. Devices P1 and N2 are a complementary pair of evaluation devices and device N1 is evaluation logic. The source of P1 is coupled to a voltage source VDD and its drain is coupled to a node 105 providing a signal HI. The drain of N1 is coupled to the node 105 and its source is coupled to the drain of N2. The source of N2 is coupled to ground. An input clocking signal CLK is provided via a node 101 to the gates of P1 and N2. An input data signal DATA is provided via a node 103 to the gate of N1. The node 105 is coupled to the input of an inverter 107 having an output coupled to a node 109 providing an output signal OUT. A weak keeper circuit 111 is coupled to the node 105. The keeper circuit 111 includes a first inverter 111A having its input coupled to node 105 for receiving the HI signal and having its output coupled to the input of a second inverter 111B. The output of the second inventor 111B is coupled to node 105.

Figure 2:
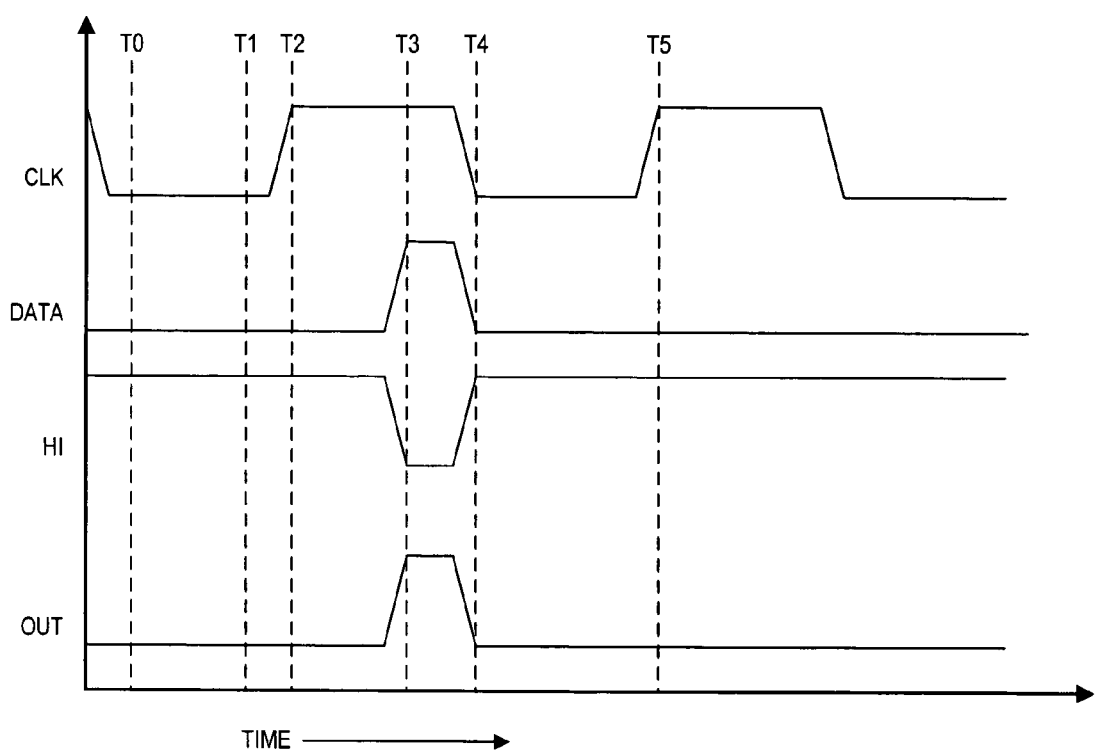
FIG. 2 is a timing diagram illustrating operating characteristics of the dynamic logic circuit of FIG. 1.

Referring now to FIG. 2, a timing diagram 200 is presented illustrating operation of the dynamic circuit 100, in which the CLK, DATA, HI, and OUT signals are plotted versus time. At a time T0 when the CLK signal is low, N2 is turned off and P1 is turned on, which pre-charges the HI signal to a logic high level in preparation for evaluation of the DATA signal upon the rising edge of CLK. During the half cycle when the CLK signal is low (i.e., the "non-clocking" state of CLK), the OUT signal is also asserted low by the inverter 107. Signal DATA is typically low as well during the half cycle when CLK is low, as is shown at time TI, because dynamic circuits 100 such as that shown in FIG. 1A are typically configured in a cascaded arrangement with a preceding circuit's OUT signal connected to a subsequent circuit's DATA signal. Hence at time TI, because the DATA signal is at a logic low level, N1 is turned off.

At subsequent time T2, the CLK signal is asserted high (i.e., the "clocking" state of CLK) which turns N2 on and P1 off. Since the DATA signal is low at time T2, N1 is off so that the HI signal is not driven by the input portion. During this time, however, the keeper circuit 111 maintains the high logic level of the HI signal and the inverter 107 maintains the OUT signal low, thus preserving the state of DATA which is sampled on the rising edge of CLK. However, if the DATA signal is driven to a high logic level during the half cycle while the CLK signal is high, as shown at subsequent time T3, then N1 turns on while N2 is on, which overpowers the keeper circuit 111 so that the HI signal is discharged to a low logic level. The inverter 107 responds by driving the OUT signal high, thus changing that state of the output node 109. Consequently, the output signal OUT no longer reflects the state of the DATA which was sampled on the rising edge of CLK.

At this point, the present inventor notes that the prior art dynamic circuit 100 exhibits, as one skilled in the art will appreciate, a setup time requirement which is zero (or less than zero, practically speaking). This is because DATA is allowed to change from a logic low state to a logic high state at the time of, or even after, the rising edge of CLK, and the state of signal OUT will change to reflect the changed state of DATA.

The CLK signal subsequently goes low and the DATA signal is also driven low at time T4. The HI signal is pre-charged high once again by PI, and the OUT signal is pulled low. At subsequent time T5, the CLK signal is once again asserted high while DATA is low, so that N2 is turned on, yet N1 is turned off. The HI signal, thus, is not discharged and the OUT signal is remains low. One skilled in the art will appreciate, however, that driving DATA high at any point during the half cycle of CLK following time T5 would cause signal HI to discharge and would cause signal OUT to be driven low.

Dynamic circuits, exemplified by the dynamic circuit 100 of FIG. 1, are faster than other circuit configurations that are designed to accomplish the same logic evaluation function, including static implementations, because the output of dynamic circuits is already preset (e.g., pre-charged) to one logic state. Note that while CLK is low, the HI signal is pre-charged high so that the OUT signal is pre-charged low. Data setup time is virtually eliminated because clocking mechanisms (e.g., PI, N2) are integrated with evaluation logic (e.g., N1). One of ordinary skill in the art will appreciate as well that more complex evaluation logic (e.g., NAND function, NOR function, multiple-input mux function) can be substituted for the simple evaluation logic device N1 shown in the dynamic circuit 100 without adversely impacting its speed or its associated power constraints.

Although dynamic circuits are fast, they heretofore have not provided for a latching mechanism on the input DATA signal or a registering mechanism for the OUT signal. And as alluded to above, the OUT signal can change from low to high in response to the DATA signal changing from low to high after initially being evaluated low during the half cycle while the CLK signal is still high. This is why pipeline logic designers have been required to provide workarounds to provide for stable outputs for these devices. One such workaround technique involves the use of registered inputs for existing dynamic circuits. Another workaround technique provides for a pulsed clock signal CLK having a clocking state duration that is significantly shorter than its non-clocking state. For example, if one were to reduce the duration of signal CLK in FIG. 2, such that it goes back to a low logic state prior to time T3 when that state of DATA goes back high, then the state of OUT would not change from that sampled at time T2 when CLK goes high.

But the above workarounds result in a more complex integrated circuits overall due to the necessity for registering inputs and/or providing for the generation and distribution of pulsed clock signals. The present inventors have recognized these limitations and have therefore provided a integral registering mechanism within a complex logic evaluation circuit that employs dynamic circuit principles to enhance the speed by which an data input (or "evaluant") is determined. The present invention furthermore eliminates setup time constraints exhibited by conventional register logic, significantly reduces hold time requirements for evaluation data, decouples hold time requirements from the clocking state duration of a corresponding clock signal, and that exhibits a markedly decreased clock-to-output time over that which has been heretofore provided. The present invention will now be discussed with reference to FIGS. 3-5.

Figure 3:
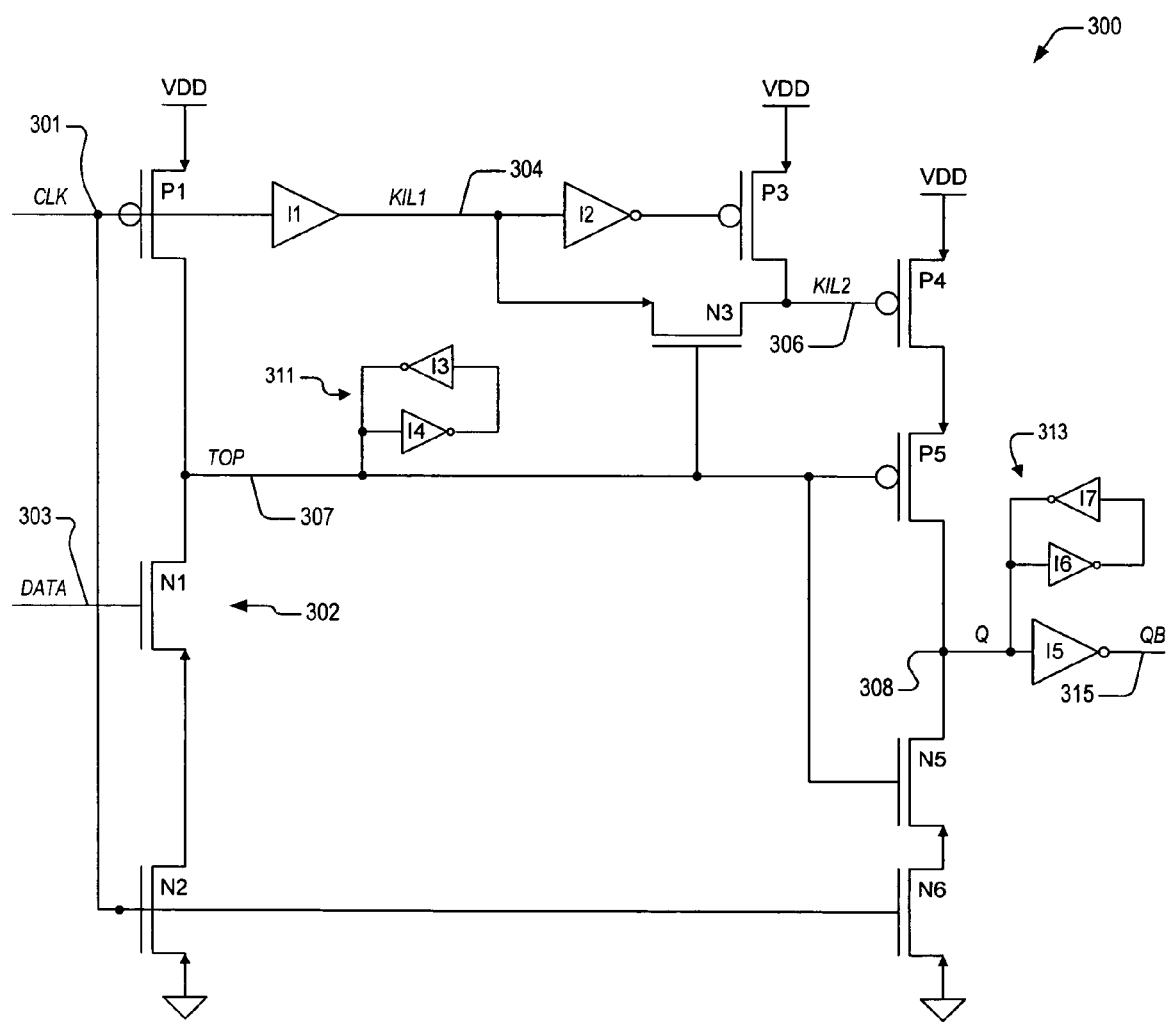
FIG. 3 is a schematic diagram of an inverting dynamic register implemented according to an exemplary embodiment of the present invention that includes a hold time reduction mechanism.

Now referring to FIG. 3, a schematic diagram is presented of an inverting dynamic register 300 implemented according to an exemplary embodiment of the present invention that includes a hold time reduction mechanism. The input portion of the dynamic logic register 300 includes a P-channel device P1 and an N-channel device N2 configured as a complementary pair of evaluation devices, along with evaluation logic 302, in a manner substantially similar to that of the dynamic circuit 100 of FIG. 1. In one embodiment, the evaluation logic 302 comprises an N-channel device N2 as shown in FIG. 2. Alternative embodiments contemplate alternative configurations of the evaluation logic 302 that comprise cascaded and/or cascoded arrangements of P-channel and/or N-channel devices to accomplish such logic evaluation functions as, but not limited to, NAND functions, NOR functions, combination NAND and NOR functions, multi-input priority mux, including logic to evaluation more that one data input. For clarity purposes, however, the following description of the dynamic register 300 according to the present invention will refer to operation of the embodiment comprising device N1 as the evaluation logic 302.

The drain of N1 is coupled to a pre-charge node 307 and its source is coupled to the drain of N2. The source of N2 is coupled to a reference voltage, which is typically ground. An input clocking signal CLK is provided via a node 101 to the gates of P1 and N2, and to the input of a non-inverting delay element I1 and an N-channel device N6. In one embodiment, the non-inverting delay element I1, or "buffer" I1, comprises two sequential inverters. An input data signal DATA is provided via a node 303 to the gate of N1. The pre-charge node 307 is coupled to the gate of an N-channel pass device N3, and to the gates of stacked P-channel and N-channel devices P5 and N5. The pre-charge node 307 is also coupled to a first weak keeper circuit 311. The keeper circuit 311 includes a first inverter I4 having its input coupled to node 307 for receiving signal TOP and having its output coupled to the input of a second inverter I3. The output of the second inverter I3 is coupled to node 307.

The output of the delay element I1 is coupled to a node 304 providing a signal KIL1. The node 304 is also coupled to the source of pass device N3 and to the input of an inverting delay element I2. In one embodiment, the inverting delay element comprises a single inverter I2. In alternative embodiments, the inverting delay element comprises an odd number of inverters configured in series to provide a delay commensurate with design requirements. Henceforth, the inverting delay element will be referred to as inverter I2. The output of the inverter I2 is coupled to a P-channel device P3. The source of P3 is coupled to a source voltage VDD and the drain of P3 is coupled to a node 306 providing a signal KIL2. The node 306 is also coupled to the drain of N3 and the gate of a P-channel kill device P4. The source of P4 is coupled to VDD and the drain of P4 is coupled to the source of P5. The drain of P5 forms a preliminary output node 308 providing a signal Q. The preliminary output node 308 is coupled to the input of a second inverter I5 and to a second weak keeper circuit 313. The second keeper circuit 313 includes an inverter I6 having its input coupled to node 308 for receiving signal Q and having its output coupled to the input of an inverter I7. The output of inverter I7 is coupled to node 308. In addition, the drain of N5 is coupled to node 308. The output of inverter I5 is coupled to an output node 315 providing an output signal QB. The drain of N6 is coupled to the source of N5 and the source of N6 is coupled to the reference voltage. The output signal QB provides an inverted state of the input signal DATA as sampled on the rising edge of CLK.

Operationally, in contrast to a present day dynamic circuit 100 as discussed above with reference to FIGS. 1 and 2, the dynamic logic register 300 according to the present invention provides an inverted registering function that is integrated with dynamic, or domino, evaluation logic 302. The inverting dynamic register 300 requires approximately zero setup time for an input signal DATA and does not require a pulsed clocking signal CLK. Furthermore, the inverting dynamic register 300 exhibits hold time requirement that is dependent upon the state of DATA when it is sampled. Such a data-dependent hold time requirement, as will be discussed in more detail below, is advantageous in cascaded domino circuit applications, in particular where a preceding domino stage provides one output state much faster than the other output state relative to CLK. According to the present invention, the hold time requirement is shortened for a first case where DATA is at a logic low level when sampled, so that the preceding domino circuit can be optimized to provide a faster clock-to-output time for DATA transitioning from a low level to a high level. The present inventors note that the preceding circuit that provides the input signal DATA need not be a domino circuit. As noted above, device P4 controls whether the state of signal TOP will be allowed to propagate through to the output node 315. When signal KIL2 goes high, device P4 turns off, thus preventing a high level from propagating through P5 (if turned on by TOP) to the preliminary output node Q.

According to the present invention, the path through which P4 is turned off after CLK goes high is accelerated if DATA is at a low logic level when CLK goes high. As noted above, such a state is useful in cascaded domino arrangements because otherwise, as described above with reference to FIGS. 1 and 2, were DATA to go back high after CLK goes high, then the state of the output signal QB would change states. And, as one skilled in the art will appreciate, the hold time requirement for DATA that is initially at a high logic level when sampled allows for proper evaluation of DATA.

In the first case when DATA is at a logic low level when sampled, node TOP remains pre-charged at a logic high level. Thus pass device N3 is already on when CLK goes high, and the logic high level of CLK passes through the delay element I1 and through the turned on pass device N3 to quickly turn off P4. As one skilled in the art will appreciate, the actual voltage level that is passed, in the first case, through to signal KIL2 is approximately VDD minus the threshold voltage of N3, and this voltage level is still sufficient to turn off P4 and to prevent a high level signal from propagating through P4 and P5 to node 308. Accordingly, the hold time requirement for this case is determined in significant part by the delay through the delay element I1. This is the useful case where it is desirable to have a shortened hold time requirement.

Alternatively, in a second case when DATA is at a logic high level when sampled, node TOP "evaluates," that is, TOP discharges to a logic low level when CLK goes high. When TOP discharges, the pass device N3 turns off, forcing the path for establishing the state of signal KIL2 through the inverter I2 and device P3, which is longer that the hold time requirement for the first case. In addition, it is noted that signal KIL1 is prevented from propagating though N3 even when TOP is partially discharged because the voltage of signal KIL2 resulting from propagation of signal KIL1 through device N3 is approximately equal to the level of TOP minus a threshold voltage. It is recommended that the sum of the delays through I1, I2, and P3 be greater than the time required for N1 to evaluate a high level on DATA such that a correct level on the preliminary output signal Q is established. And the delay through I1 need only be long enough so that a partial discharge of signal TOP forces the path for turning off P4 to be through such that KIL1 is propagated through I2 and P3 to establish the level on KIL2.

Figure 4:
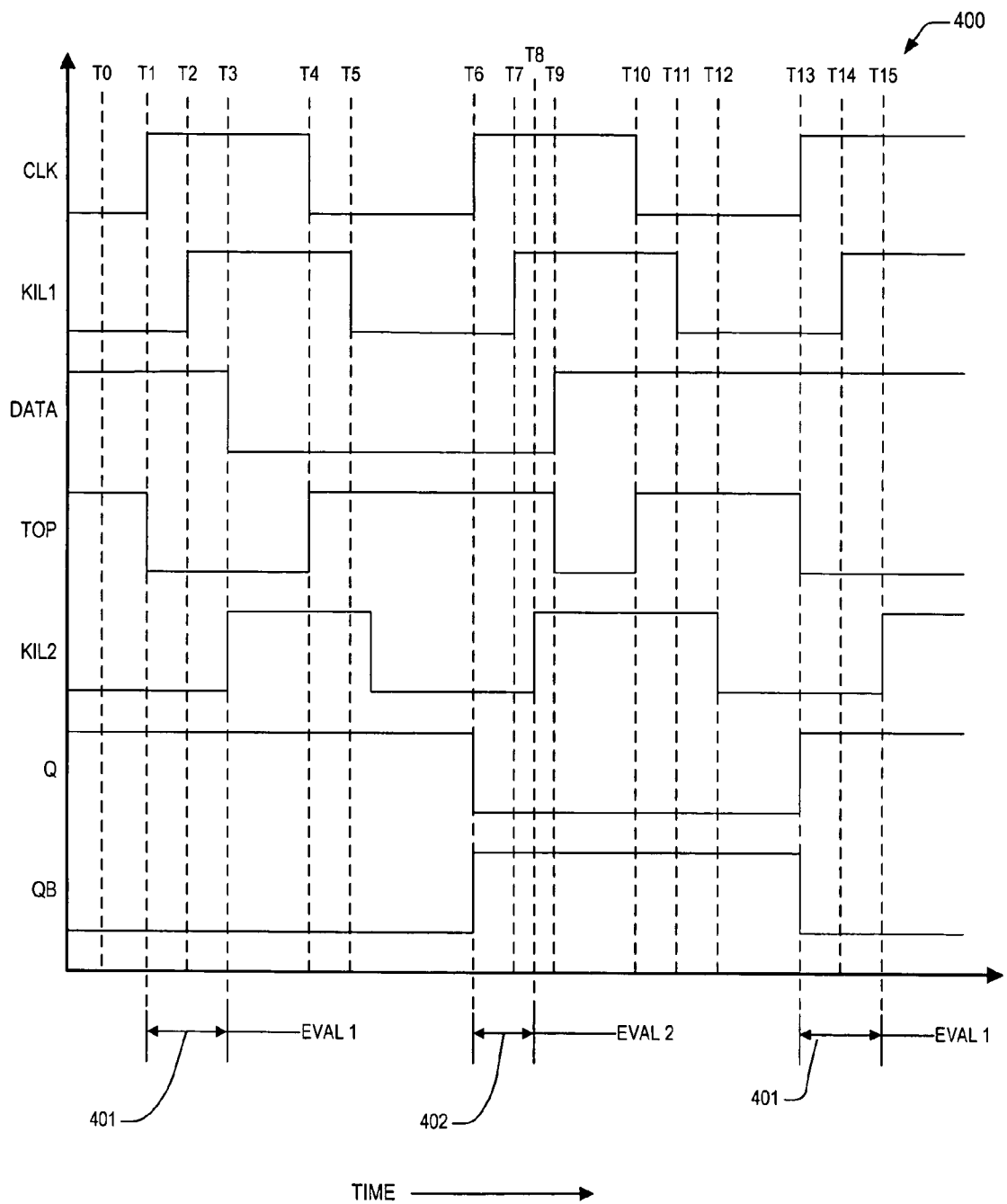
FIG. 4 is a timing diagram illustrating operation of the dynamic register of FIG. 3.

Turning now to FIG. 4, a timing diagram 400 is presented illustrating operation of the dynamic register 300 of FIG. 3, in which signals CLK, KIL1, DATA, TOP, KIL2, Q, and QB signals are plotted versus time. For clarity, relative logic delays are approximated not necessarily to scale and transition times are ignored.

In the case illustrated, at time T0 the output signal QB is initially at a logic low level, thus reflecting the inverse of preliminary output signal Q. Also at this time T0, the clock signal CLK is low, P1 is on, N2 is off, and thus signal TOP is pre-charged to a logic high level. Device N3 is consequently on, allowing signal KIL1 (i.e., a delayed version of CLK) to be propagated through N3 to node 306. Thus signal KIL2 is also low, and kill device P4 is on. But since TOP is high, devices P5 and N5 are off, thus isolating node 308, and keeper 313 retains the state of Q, and consequently, the state of QB on node 315. Also during this time, DATA is set up to a high logic level of node 303.

At time T1, CLK goes high, turning off P1 and turning on N2, enabling a discharge path to ground for signal TOP. DATA is high at time T1 and thus N1 is on, so TOP discharges to a logic low level through N1 and N2 in series. Also, when CLK goes high at time T1, device N6 is turned on as well, enabling a discharge path for node 308 to ground. Since TOP goes low at T1, N5 turns off and P5 turns on. Since P4 is still on, a logic high level is propagated from VDD through devices P4 and P5 to node 308, establishing a logic high level on signal Q, and thus the logic low level is maintained on signal QB.

But when TOP discharges at time T1, the pass device N3 turns off. However, the state of CLK does not propagates through the path of delay element I1, inverter I2, and P3, thus turning off P4, until time T3. Note that signal KIL1 goes high at time T2, after N3 is turned off, thus precluding a high logic level from turning off P4 until P3 turns on at time T3. Accordingly, an evaluation window 401 according to the present invention is shown in FIG. 4 as EVAL 1 and, as noted above, the evaluation window 401 is determined by the sum of the delays through delay element I1, inverter I2, and device P3.

At time T4, CLK goes back low, turning on P1, turning off N2 and N6, and pre-charging TOP to a logic high level. N3 thus turns on again, allowing a low level on KIL1 to propagate through N3 to node 306, thus turning on P4 again at time T5 when the low level on CLK passes through the delay element I1 to signal KIL1. But when TOP goes high at T4, P5 turns off, and N6 turns off, thus isolating Q, and the state of node 308 (logic high) is preserved by keeper 313. The state of QB is thus the inverse of the state of Q.

At time T6, DATA is low and CLK goes high, thus turning on N2 and N6, and turning off P1. But because DATA is low, N1 stays off and a high level on TOP is maintained by keeper 311. Because TOP is high, an accelerated kill path is provided for signal KIL1 through N3 to node 306. Consequently, at time T7, the high state of CLK propagates through the delay element I1 to node 304 and KIL1 goes high. KIL1 propagates through N3 to node 306 at time T8, thus turning off P4 and precluding a high level from propagating through P5 to node Q, should DATA go back high.

Indeed, at time T9, DATA does go back high, discharging TOP, and turning off N5 and turning on P5. But because P4 was turned off at time T8 by KIL2 going high, keeper 313 maintains the low level on Q, and consequently the high level on QB. Accordingly, a second evaluation window 402 according to the present invention is shown in FIG. 4 as EVAL 2 and, as noted above, the second evaluation window 402 is determined by the sum of the delays through delay element I1 and pass device N3. It is noted that the length of the second evaluation window 402 is the hold time requirement for a low level on DATA.

At time T10, CLK goes back low, turning on P1, turning off N2 and N6, and pre-charging TOP to a logic high level again. N3 thus turns on again, allowing a low level on KIL1 to propagate through N3 to node 306, thus turning on P4 again at time T12 when the low level on CLK passes through the delay element I1 to signal KIL1 (at time T11), and then subsequently through N3 to turn off P4 in time T12. But when TOP goes high at T10, P5 turns off, and N6 turns off, thus isolating Q, and the state of node 308 (logic high) is preserved by keeper 313. The state of QB is thus the inverse of the state of Q.

Operation of the inverting dynamic register 300 at times T13-T15 is substantially similar to that discussed above with reference to times T1-T3, thus exhibiting an evaluation window 401 bounded by T13 and T15.

Figure 5:
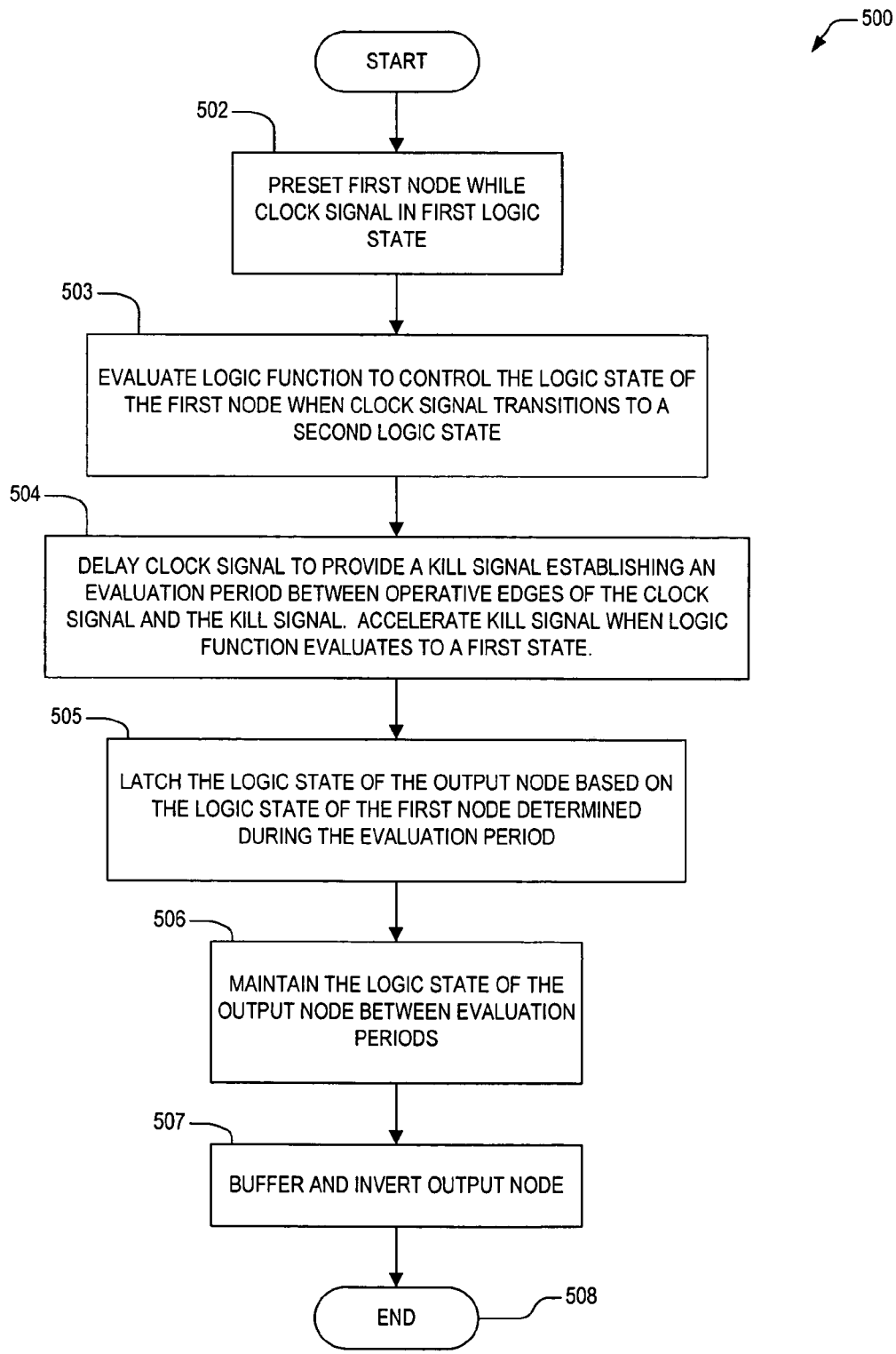
FIG. 5 is a flowchart diagram illustrating a method of dynamically registering an output signal according to an exemplary embodiment of the present invention.

Now referring to FIG. 5, a flowchart 500 is presenting depicting a method of dynamically registering an output signal according to an exemplary embodiment of the present invention.

Operation begins at a block 502, where an inverting dynamic register according to the present invention takes on a "pre-charged" state. That is, as in the exemplary embodiments discussed above with reference to FIGS. 3 and 4, a first node is preset while a clock signal is in a first logic state. In the exemplary embodiments previously described, for example, node 307 providing the TOP signal is pre-charged to a high logic state while the CLK signal is low. Operation then proceeds to block 503.

At block 503, a logic function is evaluated to control the logic state of the first node when the clock signal transitions to a second logic state. Continuing the previous example, the evaluation logic 302 evaluates a logic function based on one or more input data signals when the clock signal CLK is asserted high. The logic function is said to evaluate to a first state when the TOP signal is not discharged to a low state. The logic function is said to evaluate to a second state when the TOP signal is discharged to a low state. Flow the proceeds to block 505

At block 504, the clock signal CLK is delayed to provide a kill signal KIL2, which is a delayed replica of the clock signal CLK. When the logic function of block 503 evaluates to the first state, the kill signal is accelerated, or shortened, over that provided for when the logic function of evaluates to the second state. An evaluation period, or hold time, for a data input to the evaluation logic, is established between the operative edges of the clock signal and the kill signal. The duration of the delay from operative edge of the clock signal CLK to operative edge of the kill signal KIL2 can be configured to provide the minimum delay necessary to ensure completion of evaluation of the logic function being evaluated. Flow then proceeds to block 505.

At block 505, the logic state of the output node is latched based on the logic state of the first node as determined during the evaluation period. With reference to the inverting dynamic logic register 300, an output signal Q is latched low if TOP remains high during the evaluation period, and is latched high if TOP is pulled low during the evaluation period. Flow then proceeds to block 506.

At block 506, the logic state of the output node (e.g., the Q signal) is maintained between the expiration of each evaluation period and the beginning of the next evaluation period. In this manner, once the logic state is determined upon the expiration of each evaluation period, the state of the output Q is maintained until the next evaluation period to ensure the integrity of the output signal Q regardless of fluctuations of input data signals.

At final block 411, the output node Q is buffered and inverted to provide a complementary output signal QB, which is employed to drive subsequent inputs.

As can be noted from the above discussion, the present invention provides the speed and evaluation configurability of a dynamic circuit, along with the data retention properties of a register. In addition, the dynamic logic registering mechanism according to the present invention exhibits a zero setup time requirement, a significantly reduced hold time requirement, and a nominal clock-to-output time, thus making it much faster than configurations wherein a logical evaluator is followed by a conventional register. The delayed inversion of CLK to provide for a kill mechanism described herein above provides only a very short interval where the output of the dynamic evaluator TOP is allowed to propagate to output Q. And the hold time requirement for data inputs is significantly shortened when the data is initially sampled at a logic low level.

Although the present invention has been described in considerable detail with reference to certain preferred versions thereof, other versions and variations are possible and contemplated. For example, the inverting dynamic register can be as simple or as complex as desired. Additional qualifying logic may be implemented at any number of the nodes shown in FIG. 3 in any suitable manner as understood by those of ordinary skill in the art.

In addition, although the present disclosure contemplates one implementation using metal-oxide semiconductor (MOS) type devices, including complementary MOS devices and the like, such as, for example, NMOS and PMOS transistors, it may also be applied in a similar manner to different or analogous types of technologies and topologies, such as bipolar devices or the like.

Finally, those skilled in the art should appreciate that they can readily use the disclosed conception and specific embodiments as a basis for designing or modifying other structures for providing out the same purposes of the present invention without departing from the spirit and scope of the invention as defined by the appended claims.

What is claimed is:

1. An inverting dynamic logic register, comprising:
   a complementary pair of evaluation devices responsive to a clock signal;
   evaluation logic, coupled between said complementary pair of evaluation devices at a pre-charged node, configured to evaluate a logic function based on at least one input data signal, wherein said logic function evaluates to either a first state or a second state;
   delay logic, coupled to said clock signal, configured to generate a kill signal, wherein said kill signal is a delayed version of said clock signal, and wherein the delay between said clock and kill signals comprises a hold time, and wherein said hold time is shortened when said logic function evaluates to said first state;
   latching logic, responsive to said clock and kill signals and the state of said pre-charged node, configured to control the state of an output node based on the state of said pre-charged node during an evaluation period between an operative edge of said clock signal and the next edge of said kill signal, and configured to otherwise present a tri-state condition to said output node, wherein said latching logic comprises:
      a first P-channel pull-up device having a gate receiving said kill signal and a source and a drain coupled between a source voltage and a source of a second P-channel device, wherein said second P-channel device has a gate coupled to said pre-charge node and a drain coupled to said output node; and
      a plurality of N-channel pull-down devices, coupled between said output node and a reference voltage, and controlled by said clock signal and said pre-charged node; and
   a keeper circuit, coupled to said pre-charge node, and configured to preserve the state of said pre-charge node when said evaluation logic evaluates said logic function to said second state during said evaluation period and said at least one input data signal changes state thereafter.

2. The inverting dynamic logic register as recited in claim 1, wherein said complementary pair of evaluation devices comprises:
   a P-channel device having a gate receiving said clock signal and a drain and source coupled between a source voltage and said pre-charged node; and
   an N-channel device having a gate receiving said clock signal and a drain and source coupled between said dynamic evaluator and said reference voltage.

3. The inverting dynamic logic register as recited in claim 1, wherein said evaluation logic comprises a complex logic circuit.

4. The inverting dynamic logic register as recited in claim 1, wherein said delay logic comprises a buffer.

5. The inverting dynamic logic register as recited in claim 1, wherein said delay logic comprises a series chain of inverters.

6. The inverting dynamic logic register as recited in claim 1, wherein said delay logic comprises an inverter coupled to the gate of a P-channel device, configured to propagate said kill signal when said logic function evaluates to said second state.

7. The inverting dynamic logic register as recited in claim 1, wherein said delay logic comprises an N-channel pass device, configured to shorten said hold time when said logic function evaluates to said first state.

8. The inverting dynamic logic register as recited in claim 1, further comprising an output inverter having an input coupled to said output node and an output coupled to an inverted output node.

9. A dynamic register circuit, comprising:
   a dynamic circuit, configured to pre-charge a first node while a clock signal is low, and configured to evaluate a logic function to either a first state or a second state, and configured to control the state of the first node when said clock signal goes high;
   delay logic, configured to receive said clock signal, and configured to provide a kill signal, said kill signal being a delayed version of said clock signal, wherein the delay between said clock signal and said kill signal comprises a hold time, and wherein said hold time is shortened when said logic function evaluates to said first state;
   a latching circuit, coupled to said dynamic circuit and said delayed inverter, configured to control the state of an output node based on the state of said first node during an evaluation period beginning when said clock signal goes high and ending when said kill signal goes high, and that otherwise presents a tri-state condition to said output node, wherein said latching circuit comprises:
      a first P-channel pull-up device having a gate receiving said kill signal and a source and a drain coupled between a source voltage and a source of a second P-channel device, wherein said second P-channel device has a gate coupled to said first node and a drain coupled to said output node; and
      a plurality of N-channel pull-down device, coupled between said output node and a reference voltage, and controlled by said clock signal and said first node;
   a first keeper circuit, coupled to said first node, and configured to preserve the state of said first node when said dynamic logic evaluates said logic function to said second state during said evaluation period and one or more input data signals to said dynamic circuit change state thereafter; and
   a second keeper circuit coupled to said output node.

10. The dynamic register circuit as recited in claim 9, wherein said dynamic circuit comprises:
    a P-channel device coupled to said first node that pre-charges said first node while said clock signal is low;
    a logic circuit, coupled to said first node, that evaluates said logic function; and
    an N-channel device, coupled to said logic circuit, that enables said logic circuit to evaluate said logic function to said second state when said clock signal goes high.

11. The dynamic register circuit as recited in claim 9, wherein said delay logic comprises a series chain of inverters.

12. The dynamic register circuit as recited in claim 11, wherein said delay logic additionally comprises one or more inverters coupled to the gate of a P-channel device, configured to propagate said kill signal when said logic function evaluates to said second state, wherein the number of said one or more inverters is odd.

13. The dynamic register circuit as recited in claim 11, wherein said delay logic additionally comprises an N-channel pass device, configured to shorten said hold time when said logic function evaluates to said first state.

14. A method of dynamically registering an output signal, comprising:
  pre-setting a first node while a clock signal is in a first logic state;
  dynamically evaluating a logic function to either a first or second state to control the logic state of the first node when the clock signal transitions to a second logic state;
  delaying the clock signal and providing a kill signal, wherein the kill signal is a delayed replica of the clock signal;
  accelerating the kill signal when the logic function evaluates to the first state;
  latching a logic state of an output node based on the logic state of the first node determined during an evaluation period beginning when the clock signal transitions to the second logic state and ending with the next corresponding transition of the kill signal, wherein said latching comprises:
    first providing a first P-channel pull-up device having gate receiving the kill signal and a source and a drain coupled between a source voltage and a source of a second P-channel device, wherein the second P-channel device has a gate coupled to the first node and a drain coupled to the output node; and
    second providing a plurality of N-channel pull-down devices, coupled between the output node and a reference voltage, and controlled by the clock and the pre-charged node;
  maintaining the logic state of the output node between evaluation periods; and
  preserving the state of the first node during the evaluation periods when the first node is at the second logic state.

15. The method as recited in claim 14, wherein said pre-setting a first node comprises pre-charging the first node to a high logic state.

16. The method as recited in claim 14, further comprising buffering and inverting the output node.

17. The method as recited in claim 14, wherein said maintaining the logic state of the output node comprises presenting a tri-state condition to the output node and coupling a keeper circuit to the output node.

18. The method as recited in claim 14, wherein said accelerating comprises:
  shortening the delay time between the clock signal and the kill signal.

* * * * *